(12) United States Patent
Yo

(10) Patent No.: US 7,768,335 B2
(45) Date of Patent: Aug. 3, 2010

(54) VOLTAGE LEVEL SHIFTER CIRCUIT

(75) Inventor: Jung Hyun Yo, Yongin-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 0 days.

(21) Appl. No.: 12/205,764

(22) Filed: Sep. 5, 2008

(65) Prior Publication Data

US 2009/0066398 A1 Mar. 12, 2009

(30) Foreign Application Priority Data

Sep. 7, 2007 (KR) ............. 10-2007-0090757

(51) Int. Cl.
*H03L 5/00* (2006.01)

(52) U.S. Cl. ............. 327/333; 326/63; 326/81

(58) Field of Classification Search ........... 326/62–63, 326/80–81; 327/306, 333
See application file for complete search history.

(56) References Cited

U.S. PATENT DOCUMENTS 7,095,249 B2 * 8/2006 Mitarashi .............. 326/81

\* cited by examiner

*Primary Examiner*—Dinh T. Le
(74) *Attorney, Agent, or Firm*—The Law Offices of Andrew D. Fortney; Andrew D. Fortney; Duangkamol Kay Strohl

(57) ABSTRACT

A voltage level shifter circuit is provided. A high power voltage is input to a first power voltage terminal, an enable signal is input to an enable terminal, and an intermediate voltage level between the first power voltage and a high enable signal voltage is input to a second power voltage terminal. First and second inverters are connected to the enable terminal. A first transistor has a source connected to the second inverter. A second transistor has a drain connected to a drain of the first transistor, a source connected to the second power voltage terminal, and a gate connected to an output terminal of the first inverter. Third and fourth transistors have gates connected to the outputs of the first and second transistors, the fourth transistor having a source connected to the first power voltage terminal.

16 Claims, 4 Drawing Sheets

VOLTAGE LEVEL SHIFTER CIRCUIT

CROSS-REFERENCE TO RELATED APPLICATIONS

The present application claims the benefit of priority under 35 U.S.C. §119 to Korean Patent Application No. 10-2007-0090757, filed on Sep. 7, 2007, the entire contents of which are incorporated herein by reference.

BACKGROUND

Embodiments of the invention relate to voltage level shifter circuits.

Semiconductor memory devices are widely used, a typical example of which is an electrically erasable programmable read-only memory (EEPROM) that can perform write/read/erase operations using different control voltages. Such a memory device has three voltage terminals CG, RBL and TG for data write/read/erase operations, and is connected to a control circuit that transfers control signals to the voltage terminals. To this end, a voltage level shifter circuit is used to receive the control signals from the control circuit, to selectively shift the voltage of the control signal into a high-voltage level, and to transfer the same to the memory device.

FIG. 1 is a circuit diagram of a voltage level shifter circuit 10.

Referring to FIG. 1, the voltage level shifter circuit 10 includes a power voltage terminal VPP to which a power voltage is applied; an output terminal OUT for transferring an output signal to the outside; an enable terminal ENb; and four transistors 11, 12, 13 and 14 for controlling the voltage of the output signal.

The sources of the first and second transistors 11 and 12 are connected to the power voltage terminal VPP, and the gate of the first transistor 11 is connected to the drain of the second transistor 12. Also, the gate of the second transistor 12 is connected to the drain of the first transistor 11 to form a coupling circuit, and the drain of the second transistor 12 is connected to the output terminal OUT and the drain of the fourth transistor 14.

The drain of the first transistor 11 is connected to the drain of the third transistor 13, and the sources of the third and fourth transistors 13 and 14 are connected to a ground terminal. The gate of the third transistor 13 is connected to the enable terminal ENb and the gate of the fourth transistor 14, and an inverter 15 is connected between the gate of the third transistor 13 and the gate of the fourth transistor 14.

The first and second transistors 11 and 12 are PMOS transistors, and the third and fourth transistors 13 and 14 are NMOS transistors.

The voltage level shifter circuit 10 operates as follows.

First, when a low-voltage (VSS) signal is input to the enable terminal ENb, the low-voltage signal is applied to the gate of the third transistor 13 to turn off the third transistor 13. Also, the low-voltage signal applied to the enable terminal ENb is inverted by the inverter 15 into a high-voltage (VDD) signal, and the high-voltage signal is input to the gate of the fourth transistor 14. Thus, the fourth transistor 14 is turned on, and a low-voltage signal is transferred through the fourth transistor 14 to the output terminal OUT. At this point, the low-voltage signal transferred to the output terminal OUT is also input to the gate of the first transistor 11 connected to the output terminal OUT, and the first transistor 11 is turned on. Thus, a high-voltage signal is input to the gate of the second transistor 12 connected to the drain of the first transistor 11. When the high-voltage signal is input to the gate, the second transistor 12 is turned off.

Second, when a high-voltage signal is input to the enable terminal ENb, a high-voltage signal is applied to the gate of the third transistor 130 to turn on the third transistor 13. When the third transistor 13 is turned on, a low-voltage signal is input to the gate of the second transistor 12 connected to the drain of the third transistor 13. Thus, the second transistor 12 is turned on and a high-voltage signal (VPP) is applied to the output terminal OUT connected to the drain of the second transistor 12. Also, the high-voltage signal is input to the gate of the first transistor 11 which is connected to the output terminal OUT, and the first transistor 11 is turned off. Thus, the high-voltage signal applied to the enable terminal ENb is inverted by the inverter 15 into a low-voltage signal, and the fourth transistor 14 is turned off.

However, an enable signal of a lower voltage level is used according to the trend of the low power and the high integration of a semiconductor device. In this case, even when a high-voltage enable signal is applied, because its voltage level is relatively low, it can be difficult to satisfy a threshold voltage that enables a turn-on operation of a transistor.

For example, if an enable signal of about 5 V is compared with an enable signal of about 1.5 V, when 1.5 V signal is input to the enable terminal ENb, the third transistor 13 (that is, an NMOS transistor) may fail to properly turn on.

FIG. 2 is a simulation graph of signals of the voltage level shifter circuit 10 when an enable signal a2 of a high level (about 5 V) is applied thereto. FIG. 3 is a simulation graph of signals of the voltage level shifter circuit 10 when an enable signal c2 of a relatively low level (about 1.5 V) is applied thereto.

In the graphs of FIGS. 2 and 3, the X (horizontal) axis represents a time axis and the Y (vertical) axis represents a voltage axis. Also, from the tops of FIGS. 2 and 3, the first graphs (a1 and c1) represent power voltage signals, the second graphs (a2 and c2) represent enable signals, the third graphs (b1 and d1) represent drain signals of the first transistor 11, and the fourth graphs (b2 and d2) represent output signals.

Referring to FIG. 2, when an enable signal a2 of a high level (about 5 V) is applied, it can be seen that each signal is normally processed as described above. For example, if the enable signal a2 is of high voltage, a drain signal b1 of the first transistor 11 is of low voltage and an output signal b2 is of high voltage.

However, referring to FIG. 3, when an enable signal c2 of a relatively low level (about 1.5 V) is applied, the first transistor 11 does not necessarily operate normally. Thus, it can be seen that the voltage of the output signal d2 is not necessarily a desired value (e.g., it may be unstable and/or may not be controlled). This causes a degradation in the operational reliability of the voltage level shifter circuit 10.

SUMMARY

Embodiments of the invention provide a voltage level shifter circuit that enables transistors to be stably turned on/off according to the voltage states of an enable signal even when an enable signal of a relatively low voltage level is used, in accordance with high integration and low power trends in semiconductor devices.

In one embodiment, a voltage level shifter circuit may comprise a first power voltage terminal providing a first power voltage; an enable terminal receiving an enable signal; a second power voltage terminal providing an intermediate voltage level less than the first power voltage; first and second inverters connected to the enable terminal; a first transistor having a source connected to the second inverter; a second transistor having a drain connected to a drain of the first transistor, a source connected to the second power voltage terminal, and a gate connected to an output terminal of the first inverter; a third transistor having a gate connected to the drain of the first transistor; and a fourth transistor having a gate connected to the drain of the first transistor, a drain connected to a drain of the third transistor, and a source connected to the first power voltage terminal.

The details of one or more embodiments are set forth in the accompanying drawings and the description below. Other features will be apparent from the description and drawings, and from the claims.

DETAILED DESCRIPTION OF THE EMBODIMENTS

Reference will now be made in detail to the embodiments of the present disclosure, examples of which are illustrated in the accompanying drawings.

An exemplary voltage level shifter circuit according to one or more embodiments will be described in detail with reference to the accompanying drawings.

Figure 4:
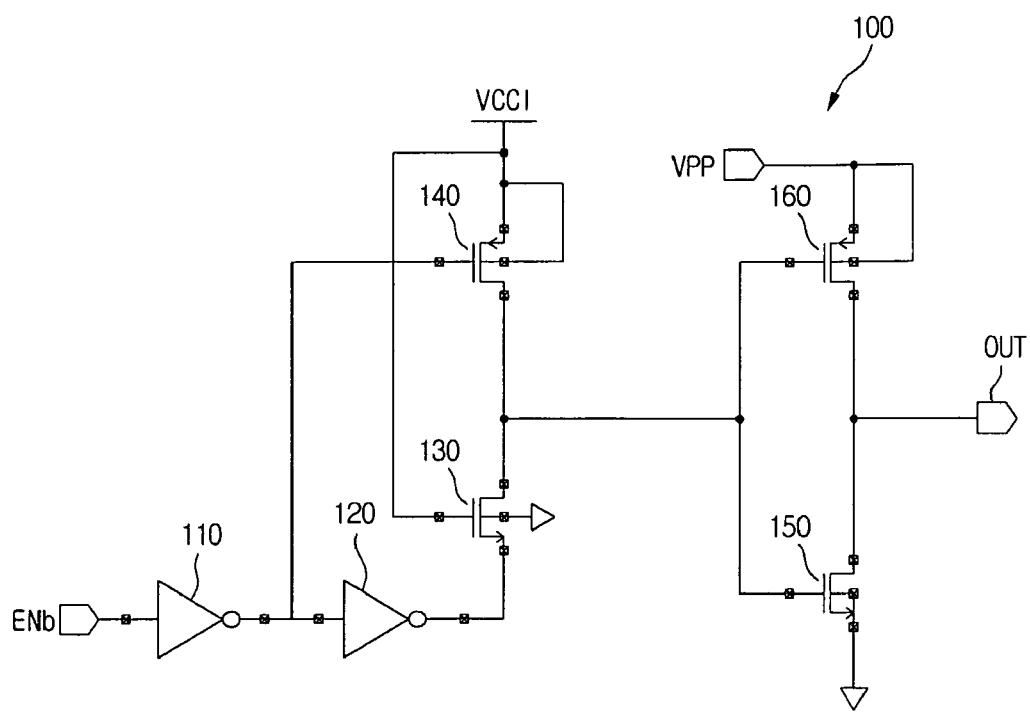
FIG. 4 is a circuit diagram of an exemplary voltage level shifter circuit according to one or more embodiments.

FIG. 4 is a circuit diagram of an exemplary voltage level shifter circuit 100.

Referring to FIG. 4, the exemplary voltage level shifter circuit 100 includes a first power voltage terminal VPP, an output terminal OUT, an enable terminal ENb, a second power voltage terminal VCC1, a first inverter 110, a second inverter 120, a first transistor 130, a second transistor 140, a third transistor 150, and a fourth transistor 160.

A first power voltage having a relatively high voltage level (e.g., about 5 V or more, about 9 V or more, or about 12 V or more) is applied to the first power voltage terminal VPP. The output terminal OUT transfers an output signal (e.g., a power supply) to the outside (e.g., a programming and/or erasing circuit in a non-volatile memory such as an EEPROM or flash memory).

An enable signal for controlling the voltage of the output signal is input to the enable terminal ENb. A second power voltage with an intermediate voltage between the first power voltage and the high-voltage (Logic High, or binary "1") enable signal is applied to the second power voltage terminal VCC1. The high voltage enable signal may have a value of from about 1.2 V to about 3 V (e.g., any value in that range, such as about 1.2 V, about 1.5 V, about 1.8 V, etc.). The intermediate voltage (e.g., VCC1) may have a value between the levels of the high voltage enable signal and the first power voltage, for example of from about 1.8 V to about 9 V (e.g., any value in that range, such as about 1.8 V, about 2.5 V, about 3.3 V, about 5 V, etc.).

Also, the first transistor 130 and the third transistor 150 are NMOS transistors and the second transistor 140 and the fourth transistor 160 are PMOS transistors.

The exemplary voltage level shifter circuit 100 according to various embodiments may be configured as follows.

The enable terminal ENb is connected through the first inverter 110 and the second inverter 120 to the source of the first transistor 130. The drain of the first transistor 130 is connected to the drain of the second transistor 140, and the source of the second transistor 140 is connected to the second power voltage terminal VCC1. Also, the gate of the first transistor 130 is connected to the second power voltage terminal VCC1 and the substrate of the first transistor 130 is grounded. Alternatively, the gate of the first transistor 130 can be connected to the output of the first inverter 110. In this alternative embodiment, the second inverter 120 may be eliminated, and the source of the first transistor 130 can be connected to ground (e.g., 0 V, or an actual or virtual ground potential).

The gate of the second transistor 140 is connected to the output of the first inverter 110 (e.g., between the first inverter 110 and the second inverter 120).

A line connecting the first transistor 130 and the second transistor 140 (e.g., the drains or outputs of the first and second transistors 130 and 140) may be branched and connected to the gate of the third transistor 150 and the gate of the fourth transistor 160, and the drain of the third transistor 150 and the drain of the fourth transistor 160 are connected to the output terminal OUT.

The source of the third transistor 150 is grounded, and the source of the fourth transistor 160 is connected to the first power voltage terminal VPP.

In various embodiments, the first through fourth transistors generally have a size and/or one or more other characteristics (such as a gate oxide thickness) configured for operations at the voltages that are generally applied to them. For example, the first and second transistors 130 and 140 may have a gate oxide thickness configured for transistor operations at the intermediate voltage level (e.g., VCC1), and the third and fourth transistors 150 and 160 may have a gate oxide thickness configured for transistor operations at the first voltage level (e.g., VPP).

The exemplary voltage level shifter circuit 100 according to the various embodiments generally operates as follows.

First, when a low-voltage (VSS) signal (e.g., a binary logic "0") is input to the enable terminal ENb, the first inverter 110 inverts the low-voltage signal into a high-voltage signal. Also, the second inverter 120 inverts the inverted high-voltage signal into a low-voltage signal and transfers the low-voltage signal to the source of the first transistor 130.

The high-voltage signal inverted by the first inverter 110 is input to the gate of the second transistor 140, and the second transistor 140 is turned off.

The signal inverted into a low-voltage state by the second inverter 120 is input to the source of the first transistor 130, and the first transistor 130 transfers the low-voltage signal from the second inverter 120 to the gates of the third and fourth transistors 150 and 160. Thus, a low-voltage signal is applied to a drain line of the first transistor 130 because the second transistor 140 is turned off.

Similarly, when the gate of the first transistor 130 is connected to the output of the first inverter 110, a high-voltage logic signal from the first inverter 110 turns on the first transistor 130, and the low-voltage logic signal from either the second inverter 120 or a ground potential can pass through the first transistor 130 to the drain or output of the first transistor 130, in the alternative embodiment(s).

Because a branch line between the first transistor 130 and the second transistor 140 (e.g., the common output node of the first and second transistors 130 and 140) is in a low-voltage state, the third transistor 150 (i.e., the NMOS transistor) is turned off and the fourth transistor 160 (i.e., the PMOS transistor) is turned on. Thus, a high-voltage signal (e.g., the first voltage level, or VPP) is output to the output terminal OUT branched between the third transistor 150 and the fourth transistor 160 (i.e., the CMOS inverter). That is, when a low-voltage enable signal is input to the voltage level shifter circuit 100, a high-voltage output signal is generated therefrom, thereby making it possible to selectively increase a control voltage or power supply of a semiconductor memory device (e.g., for programming and/or erasing operations in an EEPROM or a flash memory).

Second, when a high-voltage signal is input to the enable terminal ENb, the high-voltage signal is inverted into a low-voltage state by the first inverter 110 and a low-voltage signal is input to the gate of the second transistor 140. Also, the signal inverted into a low-voltage state by the first inverter 110 is inverted into a high-voltage signal by the second inverter 120, and the inverted high-voltage signal is input to the source of the first transistor 130. Meanwhile, the high-voltage signal inverted by the second inverter 120 is input to the source of the first transistor 130, and the first transistor 130 outputs the high-voltage signal inverted by the second inverter 120. Because the second transistor 140 is turned on and the second power voltage is applied to the branch line between the first transistor 130 and the second transistor 140, it does not matter that the first transistor 130 is on. The second inverter 120 presents a high-impedance node that has essentially no effect when both the first and second transistors 130 and 140 are on.

Similarly, when the gate of the first transistor 130 is connected to the output of the first inverter 110, a low-voltage logic signal from the first inverter 110 turns off the first transistor 130, and the low-voltage logic signal from either the second inverter 120 or the ground potential does not pass through the first transistor 130 to the drain or output of the first transistor 130, in the alternative embodiment(s).

Thus, the second power voltage is applied to the gates of the third transistor 150 and the fourth transistor 160, and the third transistor 150 is turned on while the fourth transistor 160 is turned off. The output terminal OUT outputs a low-voltage signal (e.g., a ground potential, or 0 V) by the third transistor 150.

That is, when a high-voltage enable signal is input to the exemplary voltage level shifter circuit 100, a low-voltage output signal is generated therefrom, thereby making it possible to selectively pass a control voltage or power supply to circuits in a semiconductor memory device requiring such voltage (e.g., a circuit for programming and/or erasing operations in an EEPROM or flash memory). In this way, the voltage level shifter circuit 100 according to the embodiments uses the first power voltage and the second power voltage, and may remove the ground connected to the source of the first transistor 130, thereby making it possible to apply an intermediate-voltage concept. Thus, even when an enable signal of a relatively low voltage level is used in accordance with the trends towards higher integration and lower power in semiconductor devices, the voltage level shifter circuit 100 according to the embodiments can maintain the output signal stably. For example, even when the signal level is lowered from about 5 V to 1.5 V, the enable signal enables a turn-on operation of the NMOS transistor.

Figure 5:
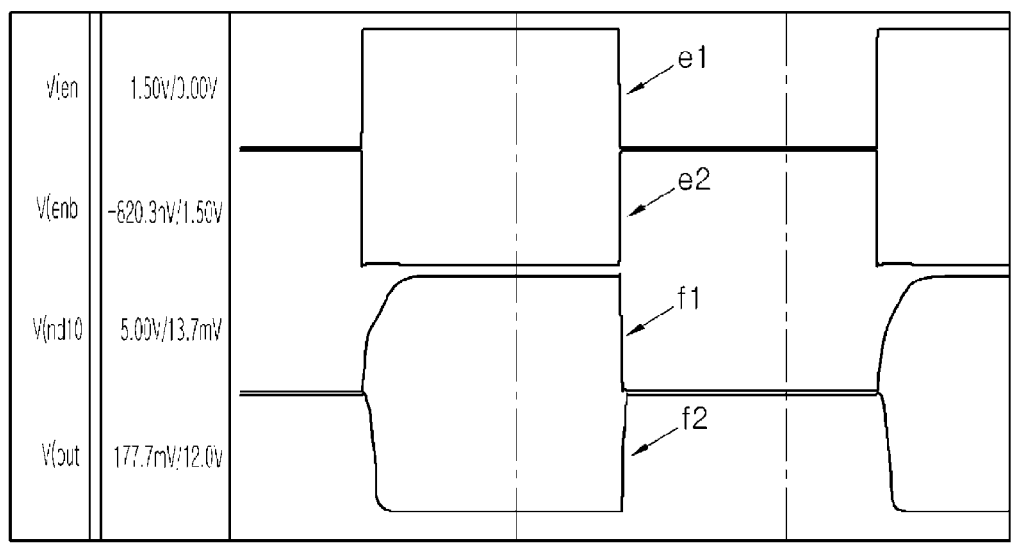
FIG. 5 is a simulation graph of signals of the exemplary voltage level shifter circuit of FIG. 4 when an enable signal of a low level is applied thereto.

FIG. 5 is a simulation graph of signals of the exemplary voltage level shifter circuit 100 when an enable signal e2 of a low level (about 1.5 V) is applied thereto. In the graph of FIG. 5, the X (horizontal) axis represents a time axis, and the Y (vertical) axis represents a voltage axis. Also, from the top of FIG. 5, the first graph (e1) represents a power voltage signal, the second graph (e2) represents an enable signal, the third graph (f1) represents a drain signal of the first transistor 130, and the fourth graph (f2) represents an output signal.

Figure 1:
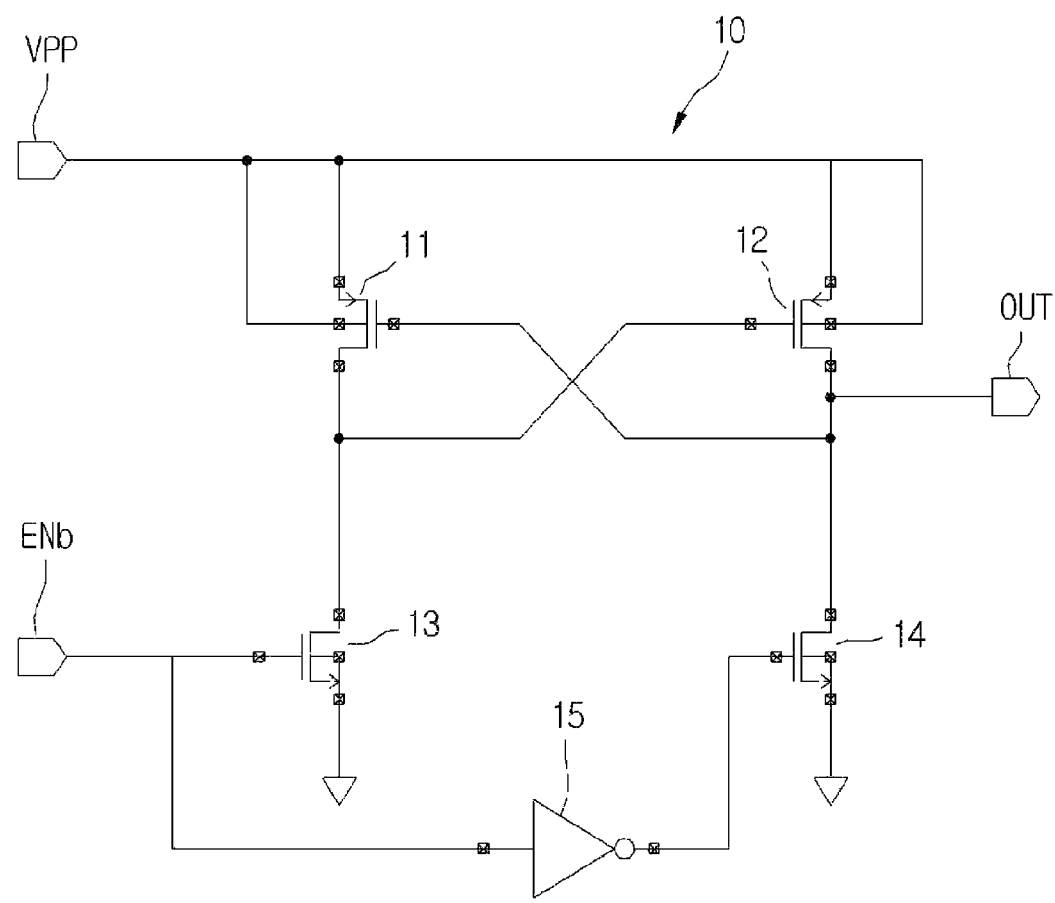
FIG. 1 is a circuit diagram of a voltage level shifter circuit.
Figure 2:
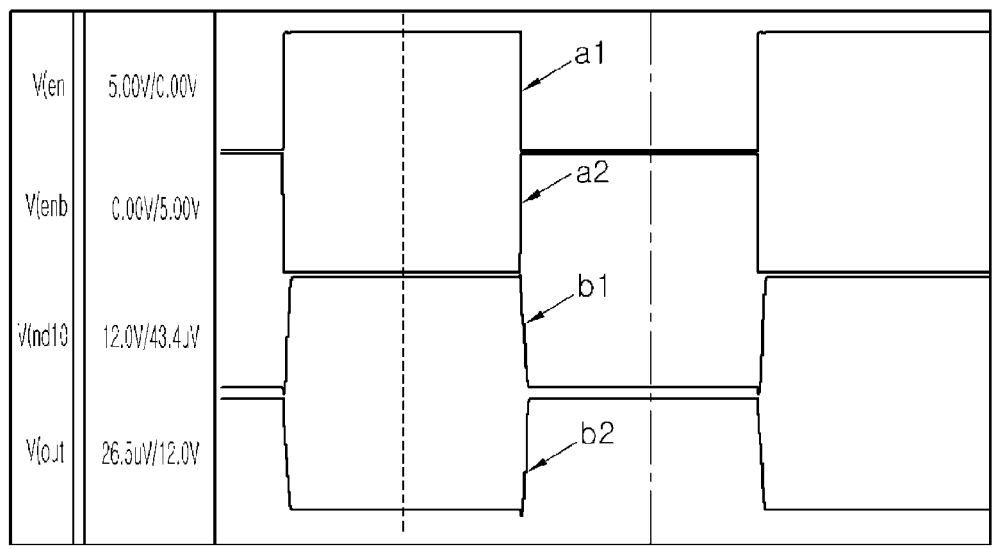
FIG. 2 is a simulation graph of signals of the voltage level shifter circuit when an enable signal of a high level is applied thereto.
Figure 3:
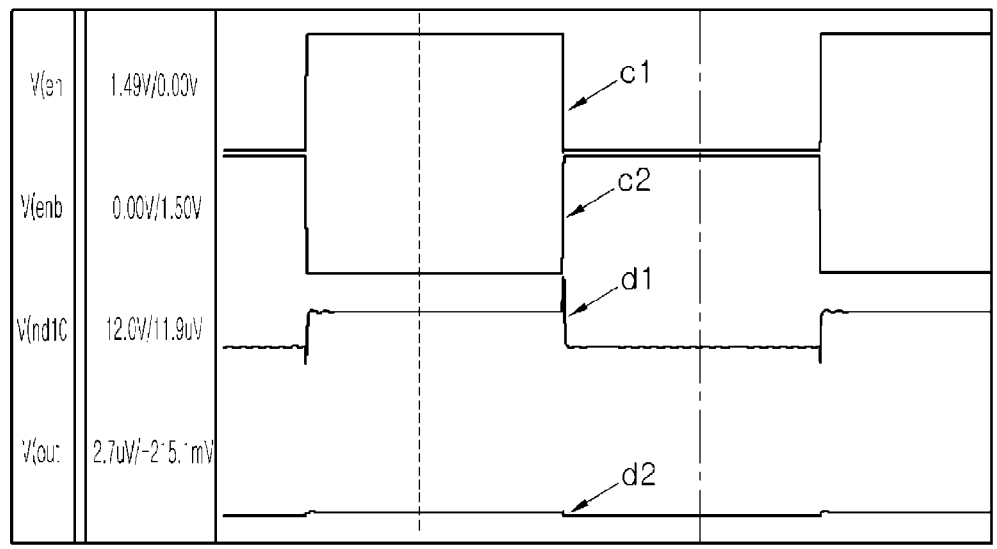
FIG. 3 is a simulation graph of signals of the voltage level shifter circuit when an enable signal of a low level is applied thereto.

Referring to FIG. 5, as described with reference to FIG. 2, when an enable signal e2 of a low level (about 1.5 V) is applied, it can be seen that each signal is normally processed. For example, if the enable signal e2 is of high voltage, a drain signal f1 of the first transistor 130 is of low voltage and an output signal f2 is of high voltage.

According to the embodiments, because the transistor can be stably turned on/off according to the voltage states of the enable signal even when an enable signal of a low voltage level is used, it is possible to enhance the operational reliability of the voltage level shifter circuit.

Also, because the transistor can be operated even when a high-voltage enable signal with a voltage level lower than the threshold voltage of one or more of the transistors in the voltage level shifter circuit is applied, it is possible to implement a voltage level shifter circuit on a high-integration and low-power semiconductor device.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A voltage level shifter circuit comprising:
    a first power voltage terminal providing a first power voltage;
    an enable terminal receiving an enable signal;
    a second power voltage terminal providing an intermediate voltage level less than the first power voltage;
    first and second inverters connected to the enable terminal;
    a first transistor having a source connected to the second inverter;
    a second transistor having a drain connected to a drain of the first transistor, a source connected to the second power voltage terminal, and a gate connected to an output terminal of the first inverter;

a third transistor having a gate connected to the drain of the first transistor; and a fourth transistor having a gate connected to the drain of the first transistor, a drain connected to a drain of the third transistor, and a source connected to the first power voltage terminal.

2. The voltage level shifter circuit according to claim 1, wherein the third transistor has a source connected to a ground potential.

3. The voltage level shifter circuit according to claim 1, wherein the first transistor has a gate connected to the second power voltage terminal.

4. The voltage level shifter circuit according to claim 1, wherein the first transistor has a gate connected to the output of the first inverter.

5. The voltage level shifter circuit according to claim 1, wherein the drain of the third transistor and the drain of the fourth transistor are connected to an output terminal of the voltage level shifter circuit.

6. The voltage level shifter circuit according to claim 1, wherein the first transistor and the third transistor are NMOS transistors.

7. The voltage level shifter circuit according to claim 1, wherein the second transistor and the fourth transistor are PMOS transistors.

8. The voltage level shifter circuit according to claim 4, wherein when an active signal is applied to the enable terminal, the first inverter inverts the active signal into a complementary signal, the second inverter inverts the complementary signal into an active state signal, the second and third transistors are turned off, the first and fourth transistors are turned on, and the output terminal outputs a signal having the first power voltage.

9. The voltage level shifter circuit according to claim 4, wherein when an inactive signal is applied to the enable terminal, the first inverter inverts the inactive signal into a deactivating signal, the second inverter inverts the inverted deactivating signal into an inactive state signal, the third transistor is turned on, the second and fourth transistors are turned off, and the output terminal outputs a low-voltage signal.

10. The voltage level shifter circuit according to claim 9, wherein the second transistor is turned on, when the low-voltage signal is input to the gate of the second transistor and the second power voltage is input to the source of the second transistor.

11. The voltage level shifter circuit according to claim 10, wherein the first transistor is turned off, when the inverted high-voltage signal is input to the source of the first transistor and the second power voltage is input through the drain of the second transistor to the drain of the first transistor.

12. A voltage shifter, comprising:

a first power supply;

a second power supply having a voltage level less than the first power supply;

a first inverter receiving a control signal;

a first transistor receiving an output of the first inverter, configured to output a logic state of the control signal when the control signal is active;

a second transistor having a first source/drain terminal connected to a source/drain terminal of the first transistor, a second source/drain terminal connected to the second power supply, and a gate connected to the output of the first inverter; and a CMOS inverter receiving an output of the first and/or second transistor(s), configured to provide the first power supply when the control signal is active.

13. The voltage shifter of claim 12, further comprising a second inverter receiving the output of the first inverter and having an output connected to a second source/drain terminal of the first transistor.

14. The voltage shifter of claim 12, wherein the first transistor has a gate that is connected to the second power supply.

15. The voltage shifter of claim 12, wherein the first transistor has a gate that is connected to the output of the first inverter.

16. The voltage shifter of claim 12, wherein the CMOS inverter comprises a third transistor having a gate connected to a common source/drain terminal of the first and second transistors, and a fourth transistor having a gate connected to the common source/drain terminal of the first and second transistors, a drain connected to a drain of the third transistor, and a source connected to the first power supply.

* * * * *